United States Patent
Schneider et al.

(10) Patent No.: US 7,196,572 B2
(45) Date of Patent: Mar. 27, 2007

(54) INTEGRATED CIRCUIT FOR STABILIZING A VOLTAGE

(75) Inventors: Ralf Schneider, München (DE); Stephan Schröder, München (DE); Manfred Pröll, Dorfen (DE); Jörg Kliewer, München (DE)

(73) Assignee: Infineon Technologies, AG, Munich (DE)

( * ) Notice: Subject to any disclaimer, the term of this patent is extended or adjusted under 35 U.S.C. 154(b) by 133 days.

(21) Appl. No.: 11/123,226

(22) Filed: May 6, 2005

(65) Prior Publication Data

US 2005/0248996 A1 Nov. 10, 2005

(30) Foreign Application Priority Data

May 6, 2004 (DE) .................. 10 2004 022 425

(51) Int. Cl.
*G05F 1/10* (2006.01)
(52) U.S. Cl. ...................... 327/538; 327/543
(58) Field of Classification Search ............... None
See application file for complete search history.

(56) References Cited

U.S. PATENT DOCUMENTS

| | | | |
|---|---|---|---|
| 5,528,129 A | 6/1996 | Kaneko et al. | |
| 6,002,295 A | 12/1999 | Gens et al. | |
| 6,262,567 B1 | 7/2001 | Bartlett | |
| 6,404,274 B1 * | 6/2002 | Hosono et al. | 327/538 |
| 6,566,935 B1 | 5/2003 | Renous | |
| 6,791,212 B2 * | 9/2004 | Pulvirenti et al. | 307/113 |
| 6,906,576 B2 * | 6/2005 | Sivero et al. | 327/536 |

* cited by examiner

*Primary Examiner*—Timothy P. Callahan
*Assistant Examiner*—An T. Luu
(74) *Attorney, Agent, or Firm*—Edell, Shapiro & Finnan, LLC

(57) ABSTRACT

An integrated circuit includes an input terminal (IN) for application of a supply voltage (Vext) and an output terminal (A) for generation of an output voltage (Vout). A first branch including a first controllable resistance (T1) and a second branch including a charge pump (10) and a second controllable resistance (T2) are connected between the input terminal (IN) and the output terminal (A). A control circuit (20) alters the resistance values of the first and second controllable resistances (T1, T2) in a manner dependent on a ratio of an actual value (Vout) of the output voltage to a desired value (VSout) of the output voltage and a ratio of an actual value (Vext) of the supply voltage to a desired value (VSext) of the supply voltage. As a result, the output voltage (Vout) can be stabilized to the desired value (VSout) virtually independently of fluctuations of the supply voltage.

17 Claims, 2 Drawing Sheets

INTEGRATED CIRCUIT FOR STABILIZING A VOLTAGE

CROSS REFERENCE TO RELATED APPLICATIONS

This application claims priority under 35 U.S.C. § 119 to German Application No. DE 102004022425.0, filed on May 6, 2004, and titled "Integrated Circuit Arrangement for Stabilizing a Voltage," the entire contents of which are hereby incorporated by reference.

FIELD OF THE INVENTION

The invention relates to an integrated circuit which can be used to stabilize an internal voltage of a semiconductor chip.

BACKGROUND

For the operation of an integrated circuit, for example an integrated semiconductor memory circuit, the memory chip is connected to an external supply potential and also an external ground potential. In full-load operation of the memory module, however, voltage dips may repeatedly occur on the supply voltage and the ground voltage. Such voltage dips arise, for example, when current spikes occur on account of commands that are applied to the semiconductor memory. This problem is widespread particularly if the circuit layout of an integrated circuit does not satisfy the high-frequency requirements or the ground lines are highly inductive.

On account of these voltage fluctuations of externally applied voltages, integrated circuits are generally operated with a stabilized voltage internally. Linear regulators have hitherto been used for generating a stabilized voltage, said regulators generating, from an externally applied, non-stabilized supply voltage, a stabilized internal voltage with which the circuit components of the integrated circuit are operated. Among the linear regulators, series regulators have become widely used owing to their simple construction, particularly in integrated form. However, integrated regulators require a certain differential voltage between input and output, apart from a few special types.

Present-day memory generations are specified, in relation to the regulated and stabilized voltages used in the chip, for external supply voltages that are of the order of magnitude of the internal voltages. Thus, in future DDR-DRAM (Double Data Rate Dynamic Random Access Memory) semiconductor memories, for example, the external supply voltage will be 1.8 V+/−0.1 V, but the semiconductor memory module will be operated in a technology-dependent manner with an internal voltage of 1.8 V or 1.5 V, for example. By virtue of the non-existent or very small difference between external voltage and internal voltage, a regulation of the internal voltage by series regulators becomes impossible or inefficient.

However, if the internal voltage of an integrated circuit cannot be kept stable by means of such regulators, the result is that internal voltage networks are operated below their desired voltage. In the case of integrated semiconductor memories, this leads to a serious impairment of the specified time parameters. The specified time parameters of an integrated semiconductor memory include the precharge times, for example, which are necessary in order to precharge bit lines of a memory cell array to a common equalization potential. An impairment of the internal time parameters on account of an under voltage operation can be explained by the fact that transistor chains are generally used for generating the time parameters. If the transistors of a transistor chain are operated below a specific desired value of the supply voltage, this leads to a retardation of their switching behavior and thus to a temporal delay of a procedure generated by the transistors.

Besides the use of linear regulators, the use of charge pumps would also be conceivable for generating a stable internal supply voltage. Such charge pumps are used in integrated circuits if operating voltages lying above the externally applied supply voltage are required for operating circuit components of the integrated circuit. In the case of integrated semiconductor memories, a charge pump is used, for example, for generating the word line voltage, used to turn on the selection transistors of the memory cell array, since control voltages that lie significantly above the externally applied supply voltage are necessary here. The use of an additional charge pump for the stable voltage supply of current-intensive networks on the semiconductor memory chip cannot be realized, however, on account of the specified maximum current consumption.

SUMMARY OF THE INVENTION

An object of the present invention is to provide an integrated circuit for stabilizing a voltage in which an output voltage generated by the integrated circuit can be kept stable to the greatest possible extent independently of voltage fluctuations of an externally applied supply voltage.

Another object of the present invention is to provide a method which enables a stable output voltage to be generated from a supply voltage that may be subjected to voltage fluctuations.

The aforesaid and other objects are achieved individually and/or in combination, and it is not intended that the present invention be construed as requiring two or more of the objects to be combined unless expressly required by the claims attached hereto.

In accordance with the present invention, an integrated circuit for stabilizing a voltage comprises an input terminal for application of a supply voltage and an output terminal for generation of an output voltage. The circuit arrangement furthermore comprises a first controllable resistance, the resistance value of which is controlled by a first control signal, and a second controllable resistance, the resistance value of which is controlled by a second control signal. The integrated circuit further comprises a charge pump and a control circuit to control the first and second controllable resistances. The input terminal for application of the supply voltage is connected to the output terminal for generation of the output voltage via the first controllable resistance. The charge pump is connected, on the output side, to the output terminal for generation of the output voltage via the second controllable resistance. In addition, the control circuit is is configured to respectively feed the first and second control signals to the first and second controllable resistances, and with the aid of the first and second control signals, the ratio of the resistance values of the first and second controllable resistances is controlled in a manner dependent on the ratio of an actual value of the supply voltage to a desired value of the supply voltage as a result of which the output voltage is corrected to a desired value of the output voltage.

In one embodiment of the integrated circuit according to the invention, the charge pump is connected, on the input side, to the input terminal for application of the supply voltage.

In another embodiment of the invention, the integrated circuit includes a first comparator circuit with a first input terminal to apply an input voltage and a second input terminal to apply a reference voltage. The first input terminal of the first comparator circuit is connected to the input terminal to apply the supply voltage and the second input terminal of the first comparator circuit is connected to a terminal to apply the desired value of the supply voltage. The first comparator circuit is designed in such a way that it generates a first comparison signal on the output side in a manner dependent on the ratio of a level of its input voltage to a level of its reference voltage and feeds the comparison signal to a first input side of the control circuit.

In yet another embodiment of the invention, the integrated circuit comprises a second comparator circuit with a first input terminal for application of an input voltage and a second input terminal for application of a reference voltage. The first input terminal of the second comparator circuit is connected in this case to the output terminal. The second input terminal of the second comparator circuit is connected to a terminal for application of the desired value of the output voltage. The second comparator circuit is designed in such a way that it generates a second comparison signal on the output side in a manner dependent on the ratio of a level of its input voltage to a level of its reference voltage and feeds said comparison signal to a second input side of the control circuit.

In a further embodiment of the invention, the control circuit comprises a coding circuit. The coding circuit is connected, on the input side, to the first and second input side of the control circuit. The coding circuit is designed in such a way that it generates on the output side a coding signal which is dependent on the ratio of the actual value of the output voltage to the desired value of the output voltage and is further dependent on the ratio of the actual value of the supply voltage to the desired value of the supply voltage.

In yet another embodiment of the invention, the control circuit comprises an evaluation circuit. The coding signal is fed to the evaluation circuit on the input side. The evaluation circuit is designed in such a way that it generates on the output side a level of the first control signal and a level of the second control signal in a manner dependent on the coding signal.

In an embodiment, the coding circuit is designed as a pulse width coder. The pulse width coder can be designed in such a way that it generates, during a period duration, a first pulse signal having a first level and a second level, the coder generating the first level of the first pulse signal during a time duration. The pulse width coder is furthermore designed in such a way that the time duration of the first level of the first pulse signal is dependent on the ratio of the actual value of the output voltage to the desired value of the output voltage.

In a further embodiment according to the invention, the pulse width coder is designed in such a way that it generates, within the time duration of the first level of the first pulse signal, a second pulse signal having a first level and a second level, the coder generating the first level of the second pulse signal during a time duration and the second level during a time duration. The pulse width coder is designed in such a way that the time duration of the first level of the second pulse signal is dependent on the ratio of the actual value of the supply voltage to the desired value of the supply voltage.

In still another embodiment of the invention, the first level of the first and second pulse signals is designed as a high signal level and the second level of the first and second pulse signals is designed as a low signal level.

In another embodiment according to the invention, the first controllable resistance is designed as a series transistor with a control input and the second controllable resistance is designed as a series transistor with a control input. The first control signal is fed to the control input of the first series transistor. The second control signal is fed to the control input of the second series transistor. The series transistors are designed in such a way that the resistance value of a controllable path of each series transistor is dependent on the level of the first and second control signals that is respectively fed to each series transistor.

In another embodiment of the invention, the integrated circuit includes a memory cell array with memory cells. In this case, the memory cells in each case comprise a selection transistor and a storage capacitor. The selection transistor can be controlled into an on state by driving with a control voltage, the voltage value of which lies above the value of the supply voltage. The charge pump is designed in such a way that it generates on the output side, from the supply voltage fed to it on the input side, where the control voltage turns on the selection transistors of the memory cell array.

Therefore, there is no need to provide an additional charge pump for stabilizing the output voltage. Instead, the charge pump that has hitherto been used for generating the control voltage of the selection transistors is integrated into the integrated circuit according to the invention.

According to a further embodiment of the invention, the desired value of the output voltage is designed as a voltage level of the memory cell array.

In accordance with another embodiment of the invention, a method is provided for stabilizing an internal voltage of an integrated circuit, where an actual value of an output voltage of an integrated circuit is determined. The actual value of the output voltage is compared with a desired value of the output voltage of the integrated circuit. In addition to the voltage values of the output voltage of the integrated circuit, an actual value of a supply voltage of the integrated circuit is also determined. The actual value of the supply voltage is compared with a desired value of the supply voltage of the integrated circuit. After the two comparisons have been carried out, a first control signal is generated by a control circuit in a manner dependent on the comparison of the actual value of the output voltage with a desired value of the output voltage of the integrated circuit and the comparison of the actual value of the supply voltage with the desired value of the supply voltage of the integrated circuit. Then, a control terminal of a first series transistor, which is connected between an input terminal of the integrated circuit for application of the supply voltage and an output terminal of the integrated circuit for generation of the output voltage, is driven with the first control signal. As a result, it is possible to alter the resistance of a controllable path of the first series transistor in a manner dependent on the first control signal. Then, a second control signal is generated by the control circuit in a manner dependent on the comparison of the actual value of the output voltage with the desired value of the output voltage of the integrated circuit and the comparison of the actual value of the supply voltage with the desired value of the supply voltage of the integrated circuit. A control terminal of a second series transistor, which is connected between an output terminal of a charge pump and the output terminal of the integrated circuit, is then driven with the second control signal. As a result, it is possible to alter the resistance of a controllable path of the first series transistor in a manner dependent on the first control signal.

In another embodiment of the method according to the invention, a first comparison signal is generated by a first comparator circuit in a manner dependent on the comparison of the actual value of the supply voltage with the desired value of the supply voltage of the integrated circuit. A second comparison signal is generated by a second comparator circuit in a manner dependent on the comparison of the actual value of the output voltage with the desired value of the output voltage of the integrated circuit. A first pulse signal having a high level and a low level is thereupon generated, the high level of the first pulse signal being generated during a time duration and the time duration of the high level of the first pulse signal being dependent on a ratio of the actual value of the output voltage to the desired value of the output voltage of the integrated circuit. A second pulse signal is generated with a high level and a low level within the time duration of the high level of the first pulse signal, the high level of the second pulse signal being generated during a time duration and the time duration of the high level of the second pulse signal being dependent on a ratio of the actual value of the supply voltage to the desired value of the supply voltage of the integrated circuit.

In a further embodiment of the method according to the invention, the time duration of the first level of the first pulse signal is lengthened when the ratio of the actual value of the output voltage to the desired value of the output voltage of the integrated circuit decreases. The time duration of the first level of the first pulse signal is shortened when the ratio of the actual value of the output voltage of the integrated circuit to the desired value of the output voltage of the integrated circuit increases. Then, the resistance of the controllable path of the first series transistor is decreased in a manner dependent on the lengthening of the time duration of the first level of the first pulse signal. Conversely, the resistance of the controllable path of the first series transistor is increased in a manner dependent on the shortening of the time duration of the first level of the first pulse signal.

In yet another embodiment of the method according to the invention, the time duration of the first level of the second pulse signal is lengthened when the ratio of the actual value of the supply voltage to the desired value of the supply voltage of the integrated circuit decreases. The time duration of the first level of the second pulse signal is shortened when the ratio of the actual value of the supply voltage to the desired value of the supply voltage of the integrated circuit increases. The resistance of the controllable path of the second series transistor is thereupon decreased in a manner dependent on the lengthening of the time duration of the first level of the second pulse signal. Conversely, the resistance of the controllable path of the second series transistor is increased in a manner dependent on the shortening of the time duration of the first level of the second pulse signal.

The method according to the invention thus makes it possible to ensure a desired value of an output voltage of the integrated circuit. The output voltage may serve, for example, as an internal supply voltage of an internal network of the integrated circuit. In this case, the stable output voltage is generated directly from an externally applied supply voltage or additionally by a charge pump. For this purpose, the charge pump is preferably activated only if the externally applied supply voltage falls below the predetermined desired value. An additional current consumption by the charge pump is therefore avoided to the greatest possible extent. It occurs only when the external supply voltage falls below the desired value on account of voltage fluctuations.

The above and still further objects, features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION OF THE PREFERRED EMBODIMENTS

Figure 1:
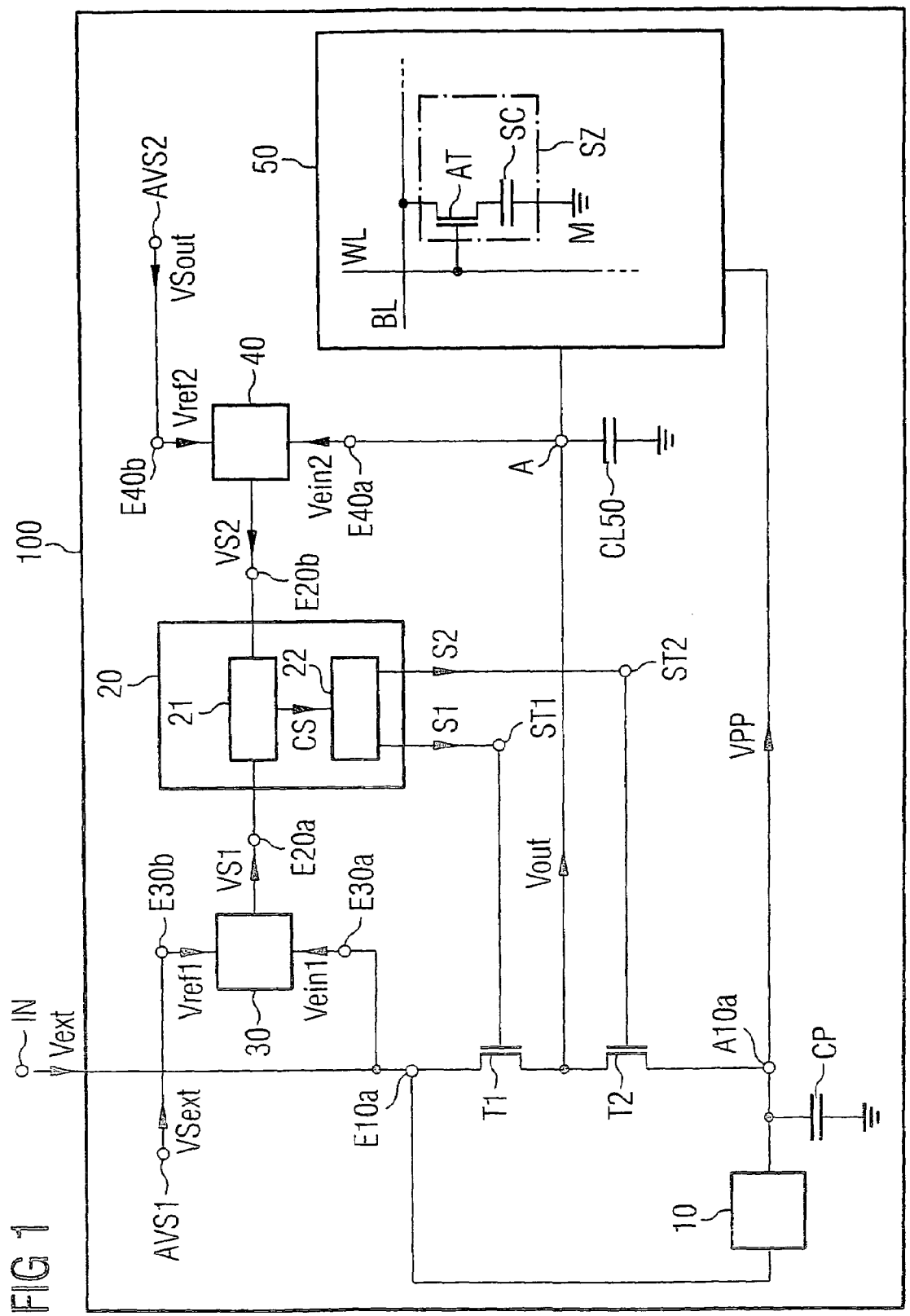
FIG. 1 depicts an embodiment of an integrated circuit for stabilizing an output voltage in accordance with the invention.

FIG. 1 depicts an embodiment of an integrated circuit which can be used, for example, within an integrated semiconductor memory to generate a stable output voltage from an externally applied supply voltage. The stable output voltage may be used as a stable internal supply voltage with which further circuit components of the integrated circuit are operated.

The integrated semiconductor memory 100 includes an input terminal IN for application of an external supply voltage Vext that is usually subjected to voltage fluctuations. The input terminal IN of the integrated circuit is connected to an output terminal A for generation of an output voltage Vout via a controllable resistance T1. By way of example, controllable resistance is designed in FIG. 1 as a series transistor. The integrated circuit further includes a charge pump 10 with a pump capacitor CP. The input terminal IN that applies the supply voltage is connected to the charge pump 10 via an input terminal E10a of the charge pump. An output terminal A10a connects the charge pump, on the output side, to the output terminal A of the integrated circuit via a controllable resistance T2. By way of example, controllable resistance T2 is designed in FIG. 1 as a series transistor. The charge pump 10 pumps the quantity of charge made available to it via the input terminal IN of the integrated circuit onto a pump capacitor CP and thus generates a pump voltage VPP lying above the externally applied supply voltage Vext.

The integrated semiconductor memory further includes a memory cell array 50, to which the output voltage Vout of the integrated circuit is made available via the output terminal A and the pump voltage VPP is made available via the output terminal A10a of the charge pump 10. The memory cell array includes memory cells SZ arranged at crossover points between a respective bit line BL and a respective word line WL. For purposes of convenience and clarity, only one memory cell SZ is illustrated within the memory cell array 50. The memory cell SZ is designed, for example, as a DRAM memory cell and includes a selection transistor AT and a storage capacitor SC. A first electrode of the storage capacitor SC is connected to the bit line BL via a controllable path of the selection transistor AT. A second electrode of the storage capacitor SC is connected to a terminal M for application of a reference potential. In order to switch the selection transistor AT into the conductive state, the pump voltage VPP is fed to a control terminal of the selection transistor via the word line WL. The memory cell array 50 can be represented in simplified manner by a capacitor CL50 that loads the output terminal A for generation of the output voltage Vout.

The integrated circuit further includes a first comparator circuit 30 with a first input terminal E30*a* for application of an input voltage Vein1 and a second input terminal E30*b* for application of a reference voltage Vref1. The first input terminal E30*a* of the first comparator circuit 30 is connected to the input terminal IN for application of the external supply voltage Vext. The second input terminal E30*b* of the first comparator circuit is connected to a terminal AVS1 for application of a desired value VSext of the supply voltage. The first comparator circuit 30 generates a first comparison signal VS1 on the output side.

The integrated circuit further includes a second comparator circuit 40 with a first input terminal E40*a* for application of an input voltage Vein2 and a second input terminal E40*b* for application of a reference voltage Vref2. The first input terminal E40*a* of the second comparator circuit 40 is connected to the output terminal A of the integrated circuit. The second input terminal E40*b* of the second comparator circuit 40 is connected to a terminal AVS2 for application of a desired value VSout of the output voltage. The second comparator circuit 40 generates a second comparison signal VS2 on the output side.

The integrated circuit further includes a control circuit 20 with a first input side E20*a*, to which the first comparison signal VS1 of the first comparator circuit 30 can be fed, and a second input side E20*b*, to which the second comparison signal VS2 of the second comparator circuit 40 can be fed. The control circuit 20 includes a coding circuit 21 and an evaluation circuit 22. The coding circuit 21, which is designed as a pulse width modulator, by way of example, feeds a coding signal CS to the evaluation circuit 22 on the input side. The evaluation circuit 22 generates a first control signal S1 on the output side and feeds it to a control terminal ST1 of the first series transistor T1. The evaluation circuit 22 further generates a second control signal S2 on the output side and feeds it to a control terminal ST2 of the second series transistor T2.

The functioning of the integrated circuit for generation of the stable output voltage Vout is described below. The first comparator circuit 30 compares the external supply voltage Vext present at the input terminal IN with the desired value VSext of the supply voltage that is applied to the terminal AVS1. Depending on the ratio of the actual value Vext to the desired value VSext of the supply voltage, the first comparator circuit 30 generates the first comparison signal VS1 and feeds it to the coding circuit 21 of the control circuit 20. The second comparator circuit 40 compares the output voltage Vout generated at the output terminal A with the desired value VSout of the output voltage that is applied to the terminal AVS2. Depending on the ratio of the actual value of the output voltage Vout to the desired value VSout of the output voltage, the second comparator circuit 40 generates the second comparison signal VS2 and feeds it to the coding circuit 21 of the control circuit 20. The coding circuit 21 generates a pulse-width-modulated coding signal CS in a manner dependent on the first and second comparison signals VS1 and VS2 fed to it on the input side, and feeds the coding signal to the evaluation circuit 22. The evaluation circuit 22 evaluates the coding signal CS and then generates the first control signal S1 and the second control signal S2. Depending on the driving of the control terminals ST1 and ST2 of the series transistors T1 and T2 with the first and the second control signal S1 and S2, respectively, the resistance of the controllable path of the first series transistor T1 and of the second series transistor T2, respectively, changes. As a result, the output terminal A for generation of the output voltage Vout is connected with higher or lower resistance to the input terminal IN for application of the external supply potential Vext and, respectively, to the output terminal A10*a* of the charge pump 10.

A method in accordance with the invention of driving the series transistors T1 and T2 in the circuit of FIG. 1 with the first and second control signals S1 and S2 for the purpose of generating the stable output voltage Vout is now described with reference to FIGS. 2, 3 and 4.

Figure 2:
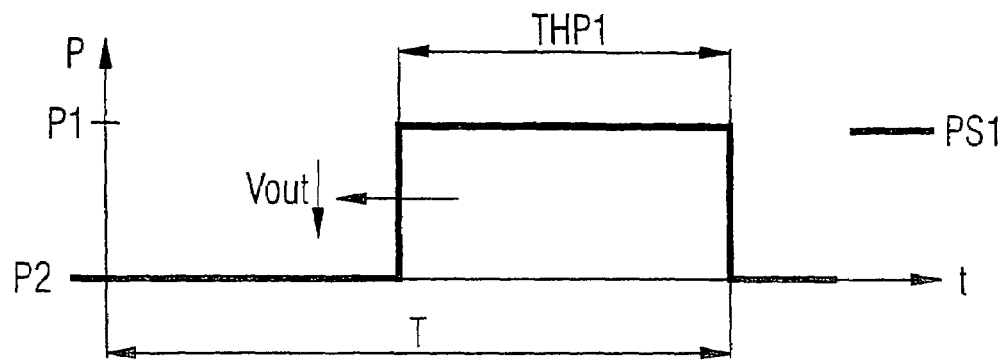
FIG. 2 is a plot a pulse-width-modulated signal generated in accordance with a first embodiment of the invention and which can be used to keep stable an output voltage of the integrated circuit of FIG. 1.

FIG. 2 depicts a first pulse signal PS1 of the pulse-width-modulated coding signal CS. The first pulse signal PS1 has the period duration T and assumes, within the period duration T, a high signal level P1 during a time duration THP1 and a low signal level P2 for the remaining time duration of the period duration T. Since the second comparison signal VS2 is dependent on the ratio of the actual value Vout to the desired value VSout of the output voltage, it is possible to ascertain on the basis of a level of the second comparison signal VS2 whether the output voltage Vout increases or decreases. If the ratio of the actual value Vout to the desired value VSout of the output voltage decreases, then a decrease in the output voltage Vout in comparison with the predetermined desired value VSout of the output voltage follows from this. In this case, the coding circuit 21 increases the time duration THP1 of the first pulse signal. If the ratio of the actual value Vout to the desired value VSout of the output voltage increases, then the actual value of the output voltage once again approximates more to the desired value of the output voltage. In this case, the coding circuit 21 decreases the time duration THP1 of the high signal level of the first pulse signal up to a specific limit. The limit determines a minimum temporal pulse width THP1 at which the actual value of the output voltage Vout precisely corresponds to the desired value VSout. From the temporal pulse width THP1 of the high signal level of the first pulse signal PS1 it is thus possible to ascertain the magnitude by which the instantaneous level of the output voltage Vout lies below the desired value VSout of the output voltage.

Figure 3:
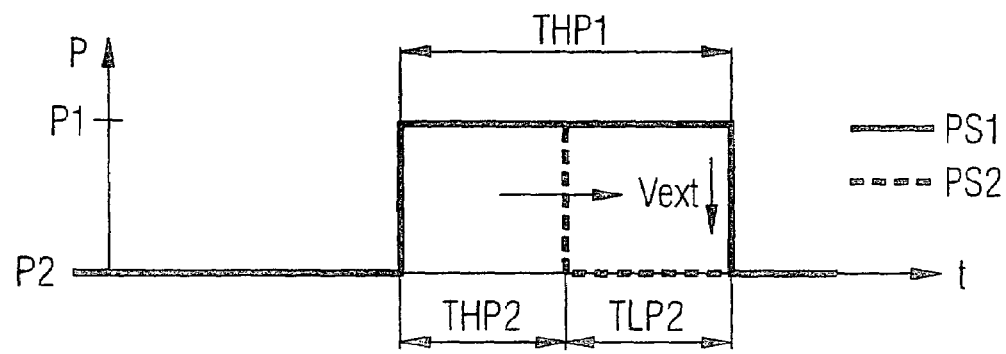
FIG. 3 is a plot of a pulse-width-modulated signal generated in accordance with a second embodiment of the present invention and which can be used to keep stable an output voltage of the integrated circuit of FIG. 1.

FIG. 3 shows the first pulse signal PS1 and a second pulse signal PS2 which together form a further form of the coding signal CS. In this case, the coding circuit 21 alters the time duration THP1, during which the first pulse signal assumes the high signal level P1, once again in the manner depicted in FIG. 2, by evaluating the second comparison signal VS2 of the comparator circuit 40. In addition to the second comparison signal VS2, the coding circuit 21 now also evaluates the first comparison signal VS1. The first comparison signal VS1 is dependent on the ratio of the actual value Vext to the desired value VSext of the supply voltage. If the ratio of the actual value Vext to the desired value VSext of the supply voltage decreases, then it is possible to infer a decrease in the external supply voltage below the predetermined desired value of the supply voltage. This information contained in the first comparison signal VS1 of the comparator circuit 30 is evaluated by the coding circuit 21 in such a way that the latter increases the time duration THP2, during which the second pulse signal PS2 assumes the high signal level P1. If the ratio of the actual value Vext to the desired value VSext of the supply voltage increases again, then the level of the actual value of the supply voltage Vext again approximates to the predetermined desired value VSext. In this case, the coding circuit 21 decreases the time duration THP2, during which the second pulse signal PS2 assumes the high signal level P1. The evaluation circuit evaluates the temporal pulse width THP1 of the first pulse signal and the temporal pulse width THP2 of the second pulse signal and generates the first control signal S1 and the second control signal S2 on the output side.

Figure 4:
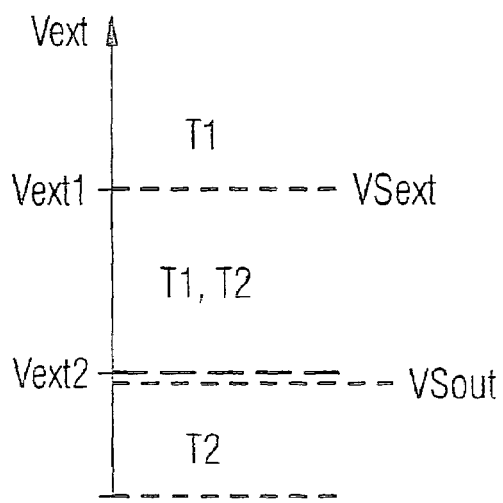
FIG. 4 is a plot of voltage ranges of an externally applied supply voltage in which series transistors T1 and T2 of FIG. 1 are activated for generating a stable output voltage in accordance with the invention.

FIG. 4 shows how the series transistors T1 and T2 are driven by the first and second control signals S1 and S2 in a manner dependent on fluctuations of the external supply voltage. If the external supply voltage Vext lies above a first threshold value Vext1, which simultaneously represents the desired value VSext of the external supply voltage, then the desired output voltage Vout can be regulated by driving the series transistor T1. If the external supply voltage falls below the desired value VSext of the external supply voltage, then the desired potential of the output voltage Vout is generated by the series transistor T2 also being switched into the on state in addition to the series transistor T1. The output voltage Vout is therefore generated by the external supply voltage Vext and also by the charge pump 10. The further the external supply voltage decreases, the greater the time duration THP2 of the second pulse signal becomes (as depicted in FIG. 3). As a result, the series transistor T2 is controlled with increasingly lower resistance, while the series transistor T1 requires ever higher resistance. The proportion of the output voltage Vout made up by the voltage component provided by the charge pump 10 thus rises in comparison with the voltage component provided by the external supply voltage Vext. If the external supply voltage has fallen to the value Vext2, then the desired output voltage is no longer generated from the externally applied supply voltage Vext. The time duration THP2, during which the second pulse signal assumes the high signal level P1, has in this case increased to the time duration THP1, during which the first pulse signal assumes the high signal level P1. The consequence of this is that the series transistor T1 is operated in turned-off fashion, while the series transistor T2 is controlled with very low resistance. The output voltage Vout of the integrated circuit is thus generated exclusively by the charge pump 10. By virtue of the fact that the series transistor T1 is operated in turned-off fashion in this case, the internal voltage network connected to the output terminal A of the integrated circuit cannot be discharged via the series transistor T1 toward the input terminal IN. The threshold Vext2 at which the series transistor T1 is operated in turned-off fashion thus lies just above the desired value VSout of the desired output voltage of the integrated circuit.

In order to alter the proportion of the voltage component supplied by the external supply voltage Vext with respect to the output voltage potential Vout or the voltage component supplied by the charge pump 10 with respect to the output voltage potential Vout, the controllable paths of the series transistors are controlled with higher or lower resistance. If the proportion of the voltage component supplied by the external supply voltage is intended to be increased, then the controllable path of the first series transistor T1 is controlled with correspondingly lower resistance. If, by contrast, the voltage component supplied by the external supply voltage with respect to the desired output voltage potential is intended to be decreased and the voltage component supplied by the charge pump 10 correspondingly intended to be increased, then the controllable path of the first series transistor T1 is controlled with higher resistance and the controllable path of the second series transistor T2 is correspondingly controlled with lower resistance.

For this purpose, it is possible to increase the signal level of the first and second control signals, whereby the controllable path of the relevant series transistor (for example, an n-channel MOSFET transistor) is correspondingly controlled with lower resistance. Conversely, the controllable path of an n-channel MOSFET transistor correspondingly acquires higher resistance if the signal level of the driving control signal is decreased.

Another method for controlling the resistances of the controllable paths of the series transistors includes operating the series transistors in pulsed fashion. The larger the temporal pulse width of the control signal within the period duration T, the lower becomes the value of the resistance of the associated controllable path. However, care must be taken to ensure that any influencing of the output voltage Vout by the digital through-switching of the series transistors is prevented since a poor regulating behavior may otherwise occur. The resistance of the controllable path of the series transistors T1 and T2 forms a low-pass filter with the relatively large capacitance CL50 to be charged of the memory cell array 50. The instantaneous voltage across the capacitance thus does not change abruptly. For a good asymptotic regulating behavior, the ratio of the period duration T of the digital driving pulse at the control terminal of the series transistors to the low-pass filter limiting frequency has to be chosen in a suitable manner.

Since the transistor losses are significantly lower in the case of a transistor operated in pulsed fashion in comparison to the case of operation at an analog fixed operating point, at least as long as the period duration T of the driving pulse does not become too short, the pulsed driving of the series transistors for altering the resistances of their controllable paths is preferable to the driving of the transistors at a fixed analog operating point with different signal levels for altering the resistances of their controllable paths.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

10 Charge pump
20 Control circuit
21 Coding circuit
22 Evaluation circuit
30, 40 Comparator circuit
50 Memory cell array
100 Integrated semiconductor memory
A Output terminal for generation of an output voltage
AT Selection transistor
AVS Terminal of the comparator circuits
BL Bit line
CL50 Load capacitance of the memory cell array
CP Pump capacitance
CS Coding signal
E Input terminal
IN Input terminal for application of a supply potential
M Reference potential terminal
PS Pulse signal
S Control signal
SC Storage capacitor
ST Control terminal SZ Memory cell
T Period duration
T1, T2 Series transistor
TH Pulse duration with a high level
TL Pulse duration with a low level
Vein Input voltage
Vext External supply potential
Vout Output voltage
Vref Reference voltage
VS Comparison signal
VSext Desired value of the external supply potential
VSout Desired value of the output voltage
WL Word line

What is claimed is:

1. An integrated circuit for stabilizing a voltage comprising:
an input terminal that applies a supply voltage;
an output terminal that generates an output voltage;
a first controllable resistance including a resistance value that is controlled by a first control signal;
a second controllable resistance including a resistance value that is controlled by a second control signal;
a charge pump; and
a control circuit to control the first and second controllable resistances;
wherein:
the input terminal that applies the supply voltage is connected to the output terminal that generates the output voltage via the first controllable resistance;
the charge pump is connected, on an output side of the charge pump, to the output terminal to facilitate generation of the output voltage via the second controllable resistance; and
the control circuit is configured to generate and respectively feed the first and second control signals to the first and second controllable resistances such that the ratio of the resistance values of the first and second controllable resistances is controlled in a manner dependent on a ratio of an actual value of the supply voltage to a desired value of the supply voltage which results in the output voltage being corrected to a desired value of the output voltage.

2. The integrated circuit of claim 1, wherein the charge pump is connected, on an input side of the charge pump, to the input terminal that applies the supply voltage.

3. The integrated circuit of claim 1, further comprising:
a first comparator circuit with a first input terminal that applies an input voltage and a second input terminal that applies a reference voltage;
wherein:
the first input terminal of the first comparator circuit is connected to the input terminal that applies the supply voltage, and and the second input terminal of the first comparator circuit is connected to a terminal that applies the desired value of the supply voltage; and
the first comparator circuit is configured to generate a first comparison signal on an output side of the first comparator circuit, the first comparison signal being generated in a manner dependent on a ratio of a level of the input voltage applied by the first input terminal of the first comparator circuit to a level of the reference voltage applied by the second input terminal of the first comparator circuit, and feed the comparison signal to a first input side of the control circuit.

4. The integrated circuit of claim 3, further comprising:
a second comparator circuit with a first input terminal that applies an input voltage and a second input terminal that applies a reference voltage;
wherein:
the first input terminal of the second comparator circuit is connected to the output terminal and the second input terminal of the second comparator circuit is connected to a terminal that applies the desired value of the output voltage; and
the second comparator circuit is configured to generate a second comparison signal on an output side of the second comparator circuit, the second comparison signal being generated in a manner dependent on a ratio of a level of the input voltage applied by the first input terminal of the second comparator circuit to a level of the reference voltage applied by the second input terminal of the second comparator circuit, and feed the comparison signal to a second input side of the control circuit.

5. The integrated circuit of claim 1, wherein:
the control circuit comprises a coding circuit;
the coding circuit is connected, on an input side of the coding circuit, to first and second input sides of the control circuit; and
the coding circuit is configured to generate, on an output side of the coding circuit, a coding signal that is dependent on the ratio of the actual value of the output voltage to the desired value of the output voltage and on the ratio of the actual value of the supply voltage to the desired value of the supply voltage.

6. The integrated circuit of claim 5, wherein:
the control circuit comprises an evaluation circuit;
the coding signal is fed to the evaluation circuit on an input side of the evaluation circuit; and
the evaluation circuit is configured to generate, on an output side of the evaluation circuit, a level of the first control signal and a level of the second control signal in a manner dependent on the coding signal.

7. The integrated circuit of claim 5, wherein the coding circuit comprises a pulse width coder.

8. The integrated circuit of claim 7, wherein:
the pulse width coder (21) is configured to generate, during a period duration, a first pulse signal having a first level and a second level, the pulse width coder generating the first level of the first pulse signal during a time duration, with the time duration of the first level of the first pulse signal being dependent on the ratio of the actual value of the output voltage to the desired value of the output voltage.

9. The integrated circuit of claim 8, wherein:
the pulse width coder is further configured to generate, within the time duration of the first level of the first pulse signal, a second pulse signal having a first level and a second level, the pulse width coder generating the first level of the second pulse signal during a first time duration and the second level of the second pulse signal during a second time duration, with the first time duration of the first level of the second pulse signal being dependent on the ratio of the actual value of the supply voltage to the desired value of the supply voltage.

10. The integrated circuit of claim 9, wherein the first level of each of the first and second pulse signals is a high signal level, and the second level of each of the first and second pulse signals is a low signal level that is less than the high signal level.

11. The integrated circuit of claim 1, wherein:
the first controllable resistance comprises a first series transistor with a control input;
the second controllable resistance is comprises a second series transistor with a control input;
the first control signal is fed to the control input of the first series transistor;
the second control signal is fed to the control input of the second series transistor; and
the first and second series transistors are configured such that a resistance value of a controllable path of each series transistor is dependent on the level of the respective first or second control signal that is fed to each series transistor.

12. The integrated circuit of claim 1, further comprising:
a memory cell array with memory cells;
wherein:
each of the memory cells comprises a selection transistor and a storage capacitor;
each selection transistor is selectively controlled into an on state by driving with a control voltage having a voltage value that is greater than a voltage value of the supply voltage; and
the charge pump is configured to generate, on the output side of the charge pump, the control voltage that turns on the selection transistors of the memory cell array when the supply voltage applied by the input terminal is fed to an input side of the charge pump.

13. The integrated circuit of claim 12, wherein the desired value of the output voltage is a voltage level of the memory cell array.

14. A method for stabilizing an internal voltage of an integrated circuit, comprising:
determining an actual value of an output voltage of the integrated circuit;
comparing the actual value of the output voltage with a desired value of the output voltage of the integrated circuit;
determining an actual value of a supply voltage of the integrated circuit;
comparing the actual value of the supply voltage with a desired value of the supply voltage of the integrated circuit;
generating a first control signal via a control circuit in a manner dependent upon the comparison of the actual value of the output voltage with the desired value of the output voltage and the comparison of the actual value of the supply voltage with the desired value of the supply voltage;
driving a control terminal of a first series transistor, the first series transistor being connected between an input terminal of the integrated circuit that applies the supply voltage and an output terminal of the integrated circuit that generates the output voltage, with the first control signal;
altering a resistance of a controllable path of the first series transistor in a manner dependent on the first control signal;
generating a second control signal via the control circuit in a manner dependent on the comparison of the actual value of the output voltage with the desired value of the output voltage and the comparison of the actual value of the supply voltage with the desired value of the supply voltage;
driving a control terminal of a second series transistor, the second series transistor being connected between an output terminal of a charge pump and the output terminal of the integrated circuit, with the second control signal; and
altering a resistance of a controllable path of the second series transistor in a manner dependent on the second control signal.

15. The method of claim 14, further comprising:
generating a first comparison signal via a first comparator circuit in a manner dependent on the comparison of the actual value of the supply voltage with the desired value of the supply voltage;
generating a second comparison signal via a second comparator circuit in a manner dependent on the comparison of the actual value of the output voltage with the desired value of the output voltage;
generating a first pulse signal having a high level and a low level, the high level of the first pulse signal being generated during a time duration that is dependent on a ratio of the actual value of the output voltage to the desired value of the output voltage; and
generating a second pulse signal having a high level and a low level within the time duration of the high level of the first pulse signal, the high level of the second pulse signal being generated during a time duration that is dependent on a ratio of the actual value of the supply voltage to the desired value of the supply voltage.

16. The method of claim 15, further comprising:
lengthening the time duration of the high level of the first pulse signal when the ratio of the actual value of the output voltage to the desired value of the output voltage decreases;
shortening the time duration of the high level of the first pulse signal when the ratio of the actual value of the output voltage to the desired value of the output voltage increases;
decreasing the resistance of the controllable path of the first series transistor in a manner dependent on the lengthening of the time duration of the high level of the first pulse signal; and
increasing the resistance of the controllable path of the first series transistor in a manner dependent on the shortening of the time duration of the high level of the first pulse signal.

17. The method of claim 15, further comprising:
lengthening the time duration of the high level of the second pulse signal when the ratio of the actual value of the supply voltage to the desired value of the supply voltage decreases;
shortening the time duration of the high level of the second pulse signal when the ratio of the actual value of the supply voltage of the integrated circuit to the desired value of the supply voltage increases,
decreasing the resistance of the controllable path of the second series transistor in a manner dependent on the lengthening of the time duration of the high level of the second pulse signal; and
increasing the resistance of the controllable path of the second series transistor in a manner dependent on the shortening of the time duration of the high level of the second pulse signal.

* * * * *